United States Patent
Kuan et al.

(10) Patent No.: US 10,109,739 B2
(45) Date of Patent: Oct. 23, 2018

(54) FIN FIELD EFFECT TRANSISTOR

(71) Applicant: Taiwan Semiconductor Manufacturing Co., Ltd., Hsinchu (TW)

(72) Inventors: Ching-Hua Kuan, Kaohsiung (TW); Chen-Chieh Chiang, Kaohsiung (TW); Chi-Cherng Jeng, Tainan (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 76 days.

(21) Appl. No.: 15/099,606

(22) Filed: Apr. 15, 2016

(65) Prior Publication Data
US 2017/0301795 A1    Oct. 19, 2017

(51) Int. Cl.
*H01L 29/78* (2006.01)
*H01L 29/06* (2006.01)

(52) U.S. Cl.
CPC ...... *H01L 29/7851* (2013.01); *H01L 29/0649* (2013.01); *H01L 29/0688* (2013.01)

(58) Field of Classification Search
CPC ............ H01L 29/7851; H01L 29/0649; H01L 29/0688; H01L 27/11; H01L 27/1104
See application file for complete search history.

(56) References Cited

U.S. PATENT DOCUMENTS

| 2007/0114612 A1* | 5/2007 | Ahn | H01L 27/11 257/364 |
| 2008/0142881 A1* | 6/2008 | Mikasa | H01L 29/4236 257/330 |
| 2016/0308032 A1* | 10/2016 | Glass | H01L 29/66795 |

* cited by examiner

*Primary Examiner* — Steven Loke
*Assistant Examiner* — Juanita Rhodes
(74) *Attorney, Agent, or Firm* — JCIPRNET (57) ABSTRACT

A FinFET including a substrate, a plurality of insulators and a gate stack is provided. The substrate comprises a plurality of trenches and at least one semiconductor fin between the trenches, wherein the semiconductor fin comprises at least one groove, and the at least one groove is located on a top surface of the semiconductor fin. The insulators are disposed in the trenches. The gate stack partially covers the semiconductor fin, the at least one groove and the insulators.

20 Claims, 12 Drawing Sheets

FIN FIELD EFFECT TRANSISTOR

BACKGROUND

As the semiconductor devices keeps scaling down in size, three-dimensional multi-gate structures, such as the fin-type field effect transistors (FinFETs), have been developed to replace planar Complementary Metal Oxide Semiconductor (CMOS) devices. A structural feature of the FinFET is the silicon-based fin that extends upright from the surface of the substrate, and the gate wrapping around the conducting channel that is formed by the fin further provides a better electrical control over the channel.

Currently, FinFETs have applied to various applications. In some high power applications, the currently fabricated FinFETs do not meet the high power requirements. Accordingly, how to increase saturation current and current density of FinFETs is important to those skilled in the art.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present disclosure describe the exemplary fabricating process of a FinFET. The FinFET may be formed on bulk silicon substrates in certain embodiments of the present disclosure. Still, the FinFET may be formed on a silicon-on-insulator (SOI) substrate or a germanium-on-insulator (GOI) substrate as alternatives. Also, in accordance with the embodiments, the silicon substrate may include other conductive layers or other semiconductor elements, such as transistors, diodes or the like. The embodiments are not limited in this context.

Figure 1:
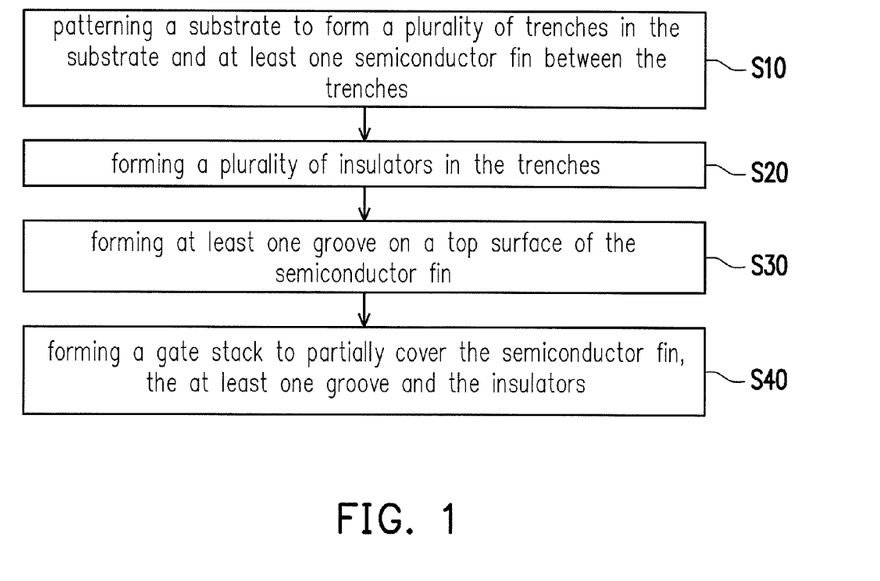
FIG. 1 illustrates a flow chart illustrating a method for fabricating a FinFET in accordance with some embodiments of the present disclosure.

FIG. 1 illustrates a flow chart illustrating a method for fabricating a FinFET in accordance with some embodiments of the present disclosure. Referring to FIG. 1, the method at least includes step S10, step S20, step S30 and step S40. First, in step S10, a substrate is patterned to form a plurality of trenches in the substrate and at least one semiconductor fin between the trenches. Then, in step S20, a plurality of insulators are formed on the substrate and in the trenches. The insulators are shallow trench isolation (STI) structures for insulating semiconductor fins, for example. In step S30, at least one groove is formed on a top surface of the semiconductor fin. Thereafter, in step S40, a gate stack is formed to partially cover the semiconductor fin, the at least one recess and the insulators. It is noted that sequence of the above-mentioned step S20 and step S30 is not limited. In some embodiments, step S20 may be performed before step S30. In alternative embodiments, step S20 may be performed after step S30.

Figure 2A:
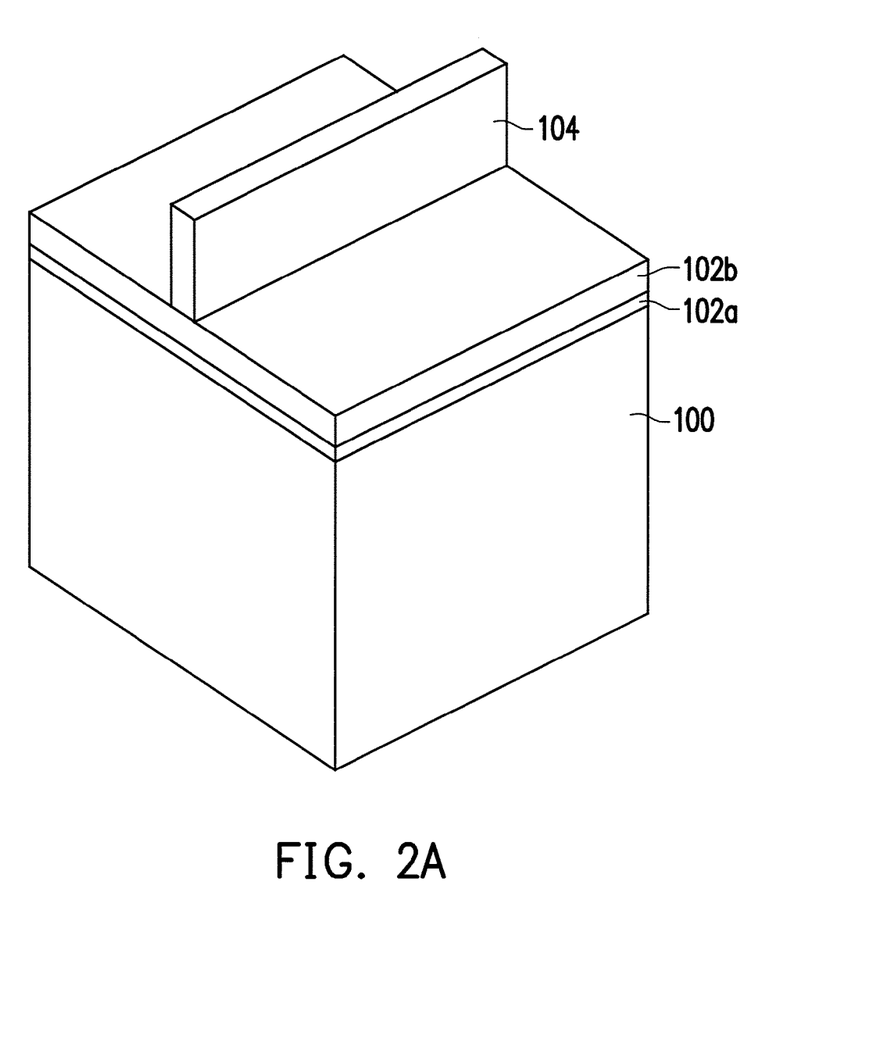
FIGS. 2A-2K are perspective views of a method for fabricating a semiconductor device in accordance with some embodiments.

FIG. 2A is a perspective view of the semiconductor device at one of various stages of the manufacturing method. In Step S10 in FIG. 1 and as shown in FIG. 2A, a substrate 100 is provided. In one embodiment, the substrate 100 comprises a crystalline silicon substrate (e.g., wafer). The substrate 100 may comprise various doped regions depending on design requirements (e.g., p-type substrate or n-type substrate). In some embodiments, the doped regions may be doped with p-type and/or n-type dopants. For example, the doped regions may be doped with p-type dopants, such as boron or $BF_2$; n-type dopants, such as phosphorus or arsenic; and/or combinations thereof. The doped regions may be configured for an n-type FinFET, a p-type FinFET or the combination thereof. In some alternative embodiments, the substrate 100 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

In one embodiment, a pad layer 102a and a mask layer 102b are sequentially formed on the substrate 100. The pad layer 102a may be a silicon oxide thin film formed, for example, by thermal oxidation process. The pad layer 102a may act as an adhesion layer between the substrate 100 and mask layer 102b. The pad layer 102a may also act as an etch stop layer for etching the mask layer 102b. In at least one embodiment, the mask layer 102b is a silicon nitride layer formed, for example, by low-pressure chemical vapor deposition (LPCVD) or plasma enhanced chemical vapor deposition (PECVD). Then, a patterned photoresist layer 104 having a predetermined pattern is formed on the mask layer 102b.

Figure 2B:
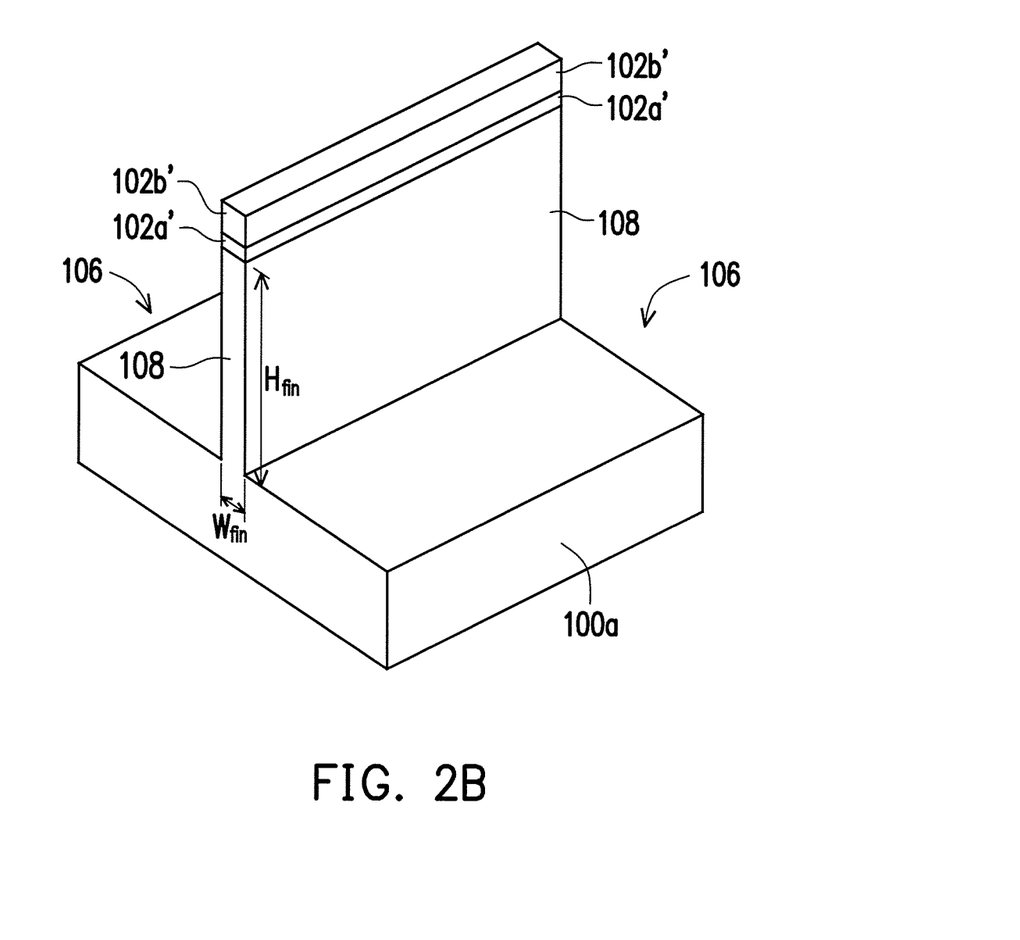

FIG. 2B is a perspective view of the semiconductor device at one of various stages of the manufacturing method. In Step S10 in FIG. 1 and as shown in FIGS. 2A-2B, the mask layer 102b and the pad layer 102a which are not covered by the patterned photoresist layer 104 are sequentially etched to form a patterned mask layer 102b' and a patterned pad layer 102a' so as to expose underlying substrate 100. By using the patterned mask layer 102b', the patterned pad layer 102a' and the patterned photoresist layer 104 as a mask, portions of the substrate 100 are exposed and etched to form trenches 106 and at least one semiconductor fin 108. The number of the semiconductor fin 108 shown in FIG. 2B is merely for illustration, in some alternative embodiments, two or more parallel semiconductor fins may be formed in accordance with actual design requirements. After the substrate 100 is patterned, the semiconductor fin 108 is covered by the patterned mask layer 102b', the patterned pad layer 102a' and the patterned photoresist layer 104. Two adjacent trenches 106 are spaced apart from each other by a semiconductor fin 108. For example, the semiconductor fin 108 has a width $W_{fin}$ and a height $H_{fin}$. The width $W_{fin}$ of the semiconductor fin 108 may be range from about 20 nm to about 50 nm and the height $H_{fin}$ of the semiconductor fin 108 may be range from about 20 nm to about 50 nm. The height $H_{fin}$ of the semiconductor fin 108 is substantially equal to the depth of the trenches 106.

After the trenches 106 and the semiconductor fin 108 are formed, the patterned photoresist layer 104 is then removed from a top surface of the patterned mask layer 102b'. In one embodiment, an optional cleaning process may be performed to remove a native oxide of the semiconductor substrate 100a and the semiconductor fin 108. The cleaning process may be performed using diluted hydrofluoric (DHF) acid or other suitable cleaning solutions.

Figure 2C:
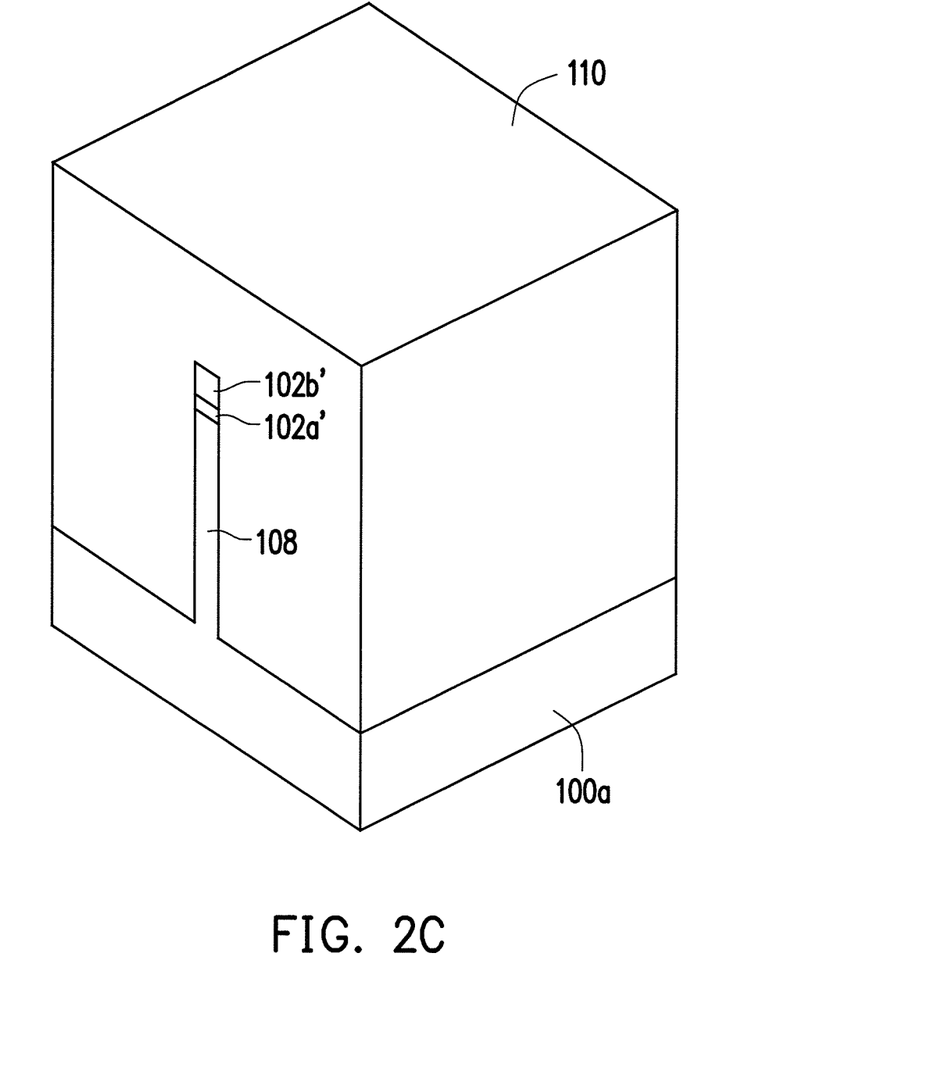

FIG. 2C is a perspective view of the semiconductor device at one of various stages of the manufacturing method. In Step S20 in FIG. 1 and as shown in FIGS. 2B-2C, an insulating material 110 are formed over the substrate 100a to cover the semiconductor fin 108 and fill up the trenches 106. In addition to the semiconductor fin 108, the insulating material 110 further covers the patterned pad layer 102a' and the patterned mask layer 102b'. The insulating material 110 may include silicon oxide, silicon nitride, silicon oxynitride, a spin-on dielectric material, or a low-K dielectric material. The insulating material 110 may be formed by high-density-plasma chemical vapor deposition (HDP-CVD), sub-atmospheric CVD (SACVD) or by spin-on.

Figure 2D:
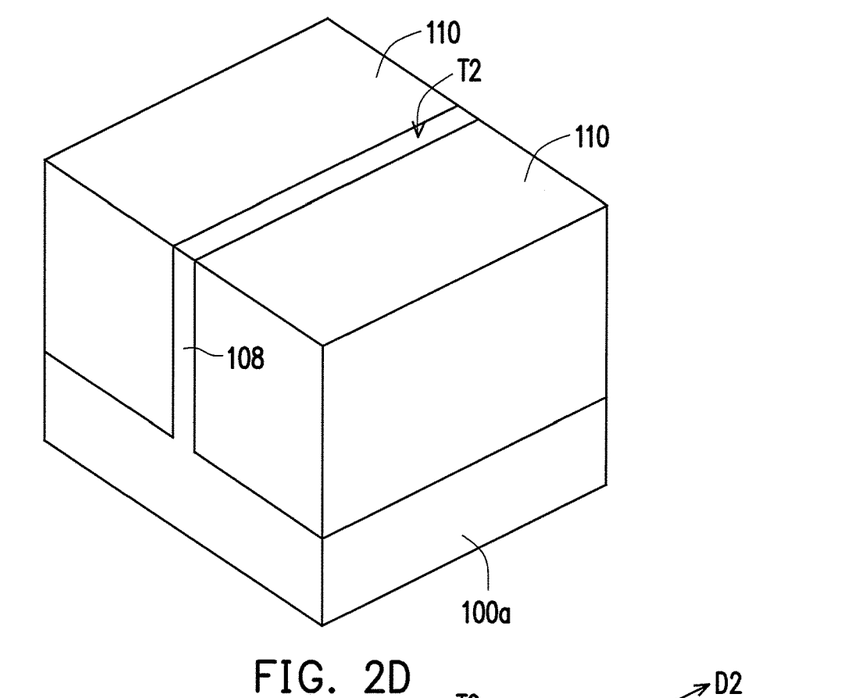

FIG. 2D is a perspective view of the semiconductor device at one of various stages of the manufacturing method. In Step S20 in FIG. 1 and as shown in FIGS. 2C-2D, a chemical mechanical polish process (CMP) is, for example, performed to remove a portion of the insulating material 110, the patterned mask layer 102b' and the patterned pad layer 102a' until a top surface T2 of the semiconductor fin 108 is exposed. As shown in FIG. 2D, after the insulating material 110 is polished, a top surface of the polished and remaining insulating material 110 is substantially coplanar with a top surface T2 of the semiconductor fin 108.

Figure 2E:
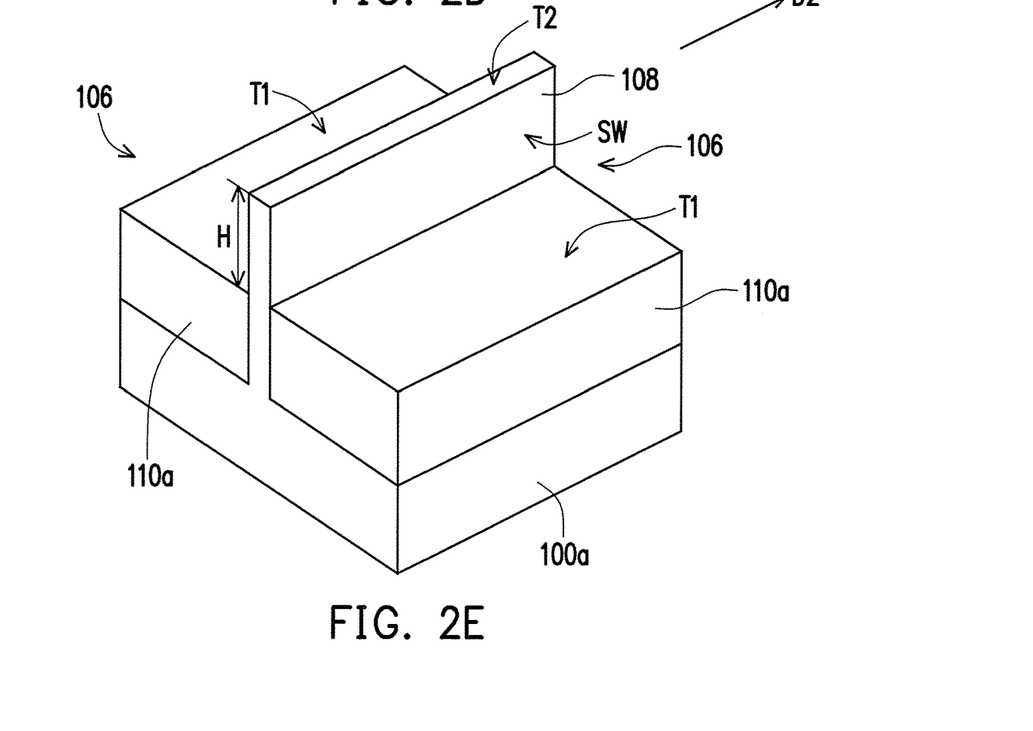

FIG. 2E is a perspective view of the semiconductor device at one of various stages of the manufacturing method. In Step S20 in FIG. 1 and as shown in FIGS. 2D-2E, the polished and remaining insulating material 110 filled in the trenches 106 is partially removed by an etching process such that a plurality of insulators 110a are formed on the substrate 100a and each insulator 110a is located in one of the trenches 106 correspondingly. In one embodiment, the etching process may be a wet etching process with hydrofluoric acid (HF) or a dry etching process. The top surfaces T1 of the insulators 110a are lower than the top surface T2 of the semiconductor fin 108. In other words, the semiconductor fin 108 protrudes from the top surfaces T1 of the insulators 110a and sidewalls SW of the semiconductor fin 108 are thus exposed. The height difference between the top surface T2 of the semiconductor fin 108 and the top surfaces T1 of the insulators 110a is H, and the height difference H ranges from about 10 nm to about 25 nm, for example.

Figure 2F:
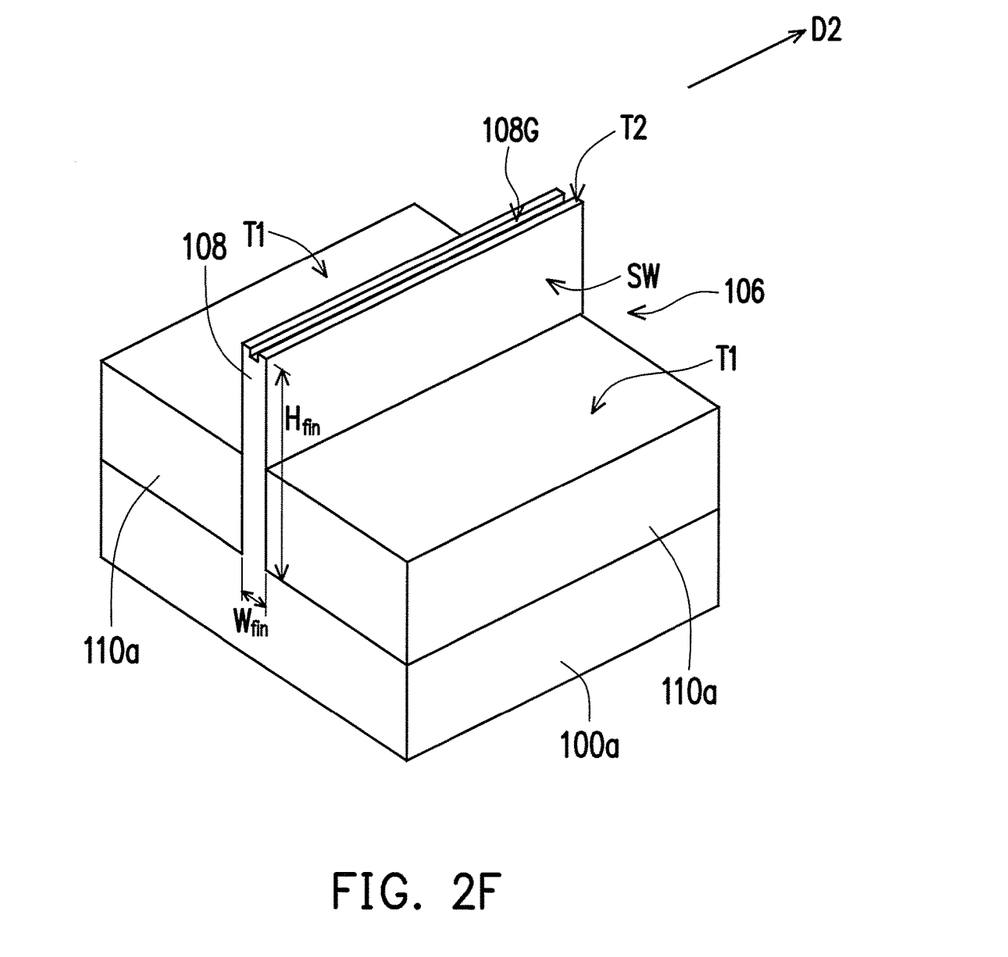

FIG. 2F is a perspective view of the semiconductor device at one of various stages of the manufacturing method. In Step S30 in FIG. 1 and as shown in FIGS. 2E-2F, at least one groove 108G is formed on the top surface T2 of the semiconductor fin 108 by photolithograph and etch processes, for example. The number and the distribution of the groove 108G shown in FIG. 2F are merely for illustration, in some alternative embodiments, two or more grooves 108G may be formed on the top surface T2 of the semiconductor fin 108 in accordance with actual design requirements. For instance, a plurality of linear grooves 108G that are substantially parallel to each other may be formed on the top surface T2 of the semiconductor fin 108. The linear groove(s) 108G may extend along a lengthwise direction D2 of the semiconductor fin 108. In alternative embodiments, at least one non-linear groove 108G may be formed on the top surface T2 of the semiconductor fin 108.

Figure 2K:
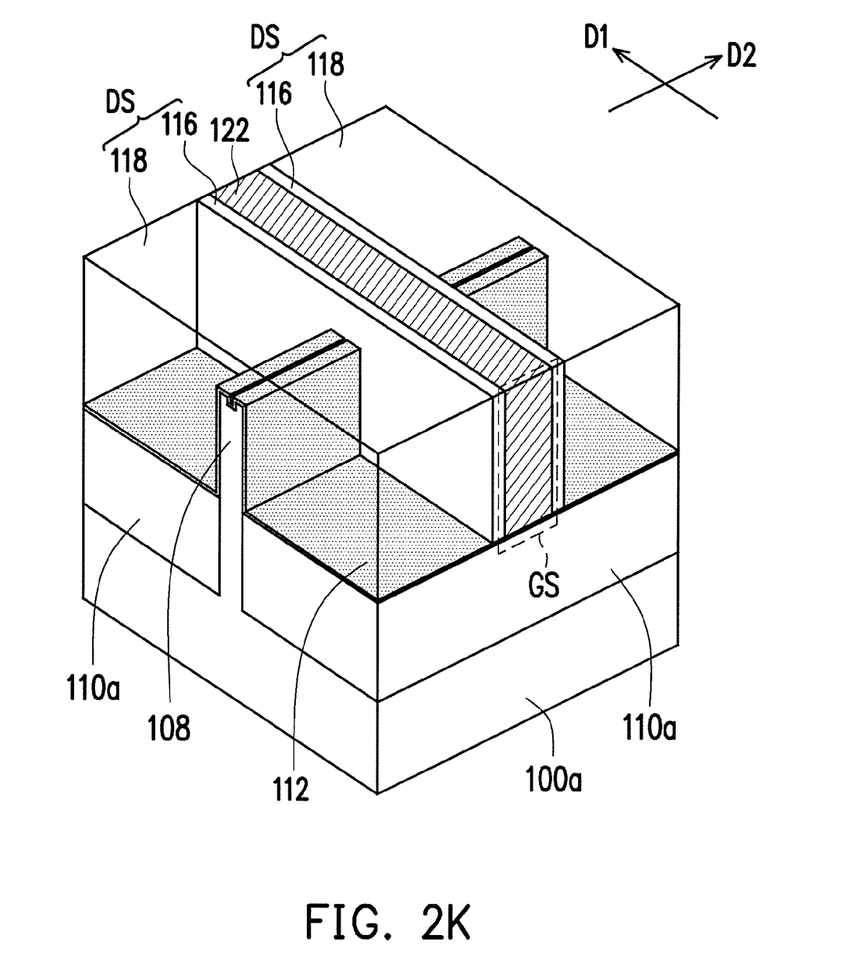
Figure 3:
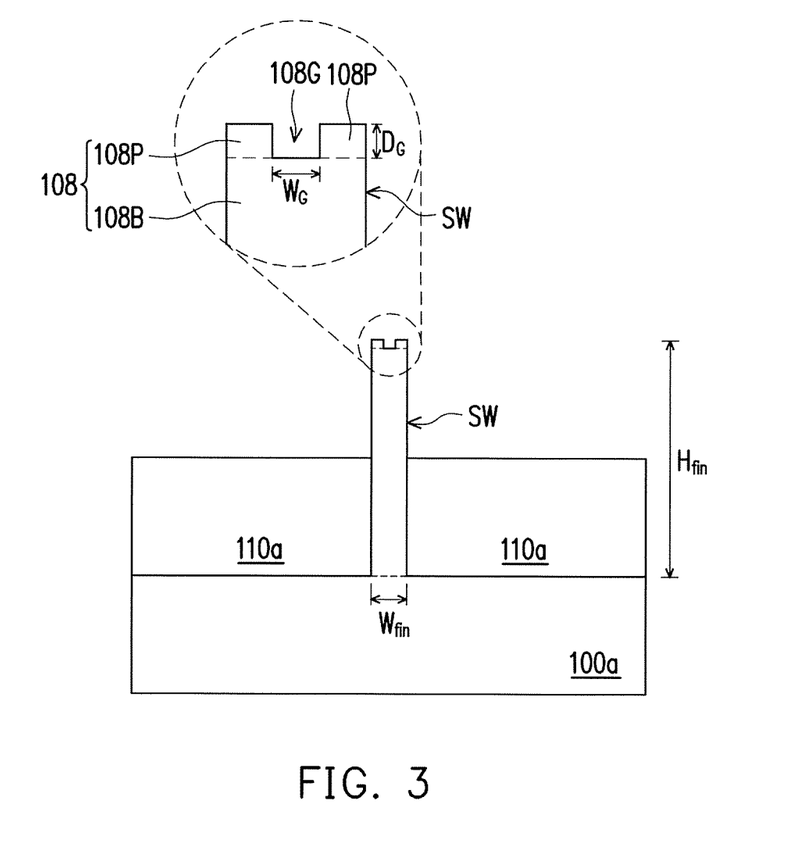
FIG. 3 is a cross-sectional view taken along the line I-I' of FIG. 2F.

FIG. 3 is a cross-sectional view taken along the line I-I' of FIG. 2F. Referring to FIG. 2F and FIG. 3, in some embodiments, the depth $D_G$ of the at least one groove 108G is in a range from about 10% to about 15% of the height Hon of the semiconductor fin 108. For example, the depth $D_G$ of the at least one groove 108G ranges from about 3 nm to about 5 nm. In some embodiments, the width $W_G$ of the at least one groove 108G is in a range from about 30% to about 50% of the width $W_{fin}$ of the semiconductor fin 108. For example, the width $W_G$ of the at least one groove 108G ranges from about 3 nm to about 5 nm. The aspect ratio (i.e. $D_G/W_G$) of the groove 108G, in some embodiments, is well controlled such that the groove 108G can be filled by the sequential formed gate dielectric layer and gate (shown in FIG. 2K). For example, the aspect ratio (i.e. $D_G/W_G$) of the groove 108G is in a range from about 1 to about 3.

As shown in FIG. 3, the semiconductor fin 108 comprises a base 108B and a plurality of protrusions 108P protruding upwardly from the base 108B, and the protrusions 108P are separated from each other by a gap (i.e. the width $W_G$ of the groove 108G).

In some embodiments, a pair of protrusions 108P are formed over the base 108B and are separated by the groove 108G. In alternative embodiments, three or more protrusions 108P are formed over the base 108B and are separated by two or more grooves 108G. The groove 108G in FIG. 3 is a groove having a rectangular cross-section. In some embodiments, the groove 108G is a groove having triangular cross-section. In alternative embodiments, the groove 108G is a groove having rounded bottom surface. When two or more grooves 108G are formed, the dimensions (i.e. width $W_G$ and/or depth $D_G$) of each groove 108G are not required to be identical. In some embodiments, three or more protrusions 108P are separated by two or more grooves 108G having different width $W_G$ and/or depth $D_G$. In alternative embodiments, three or more protrusions 108P are separated by two or more grooves 108G having same width $W_G$ and depth $D_G$.

Figure 2G:
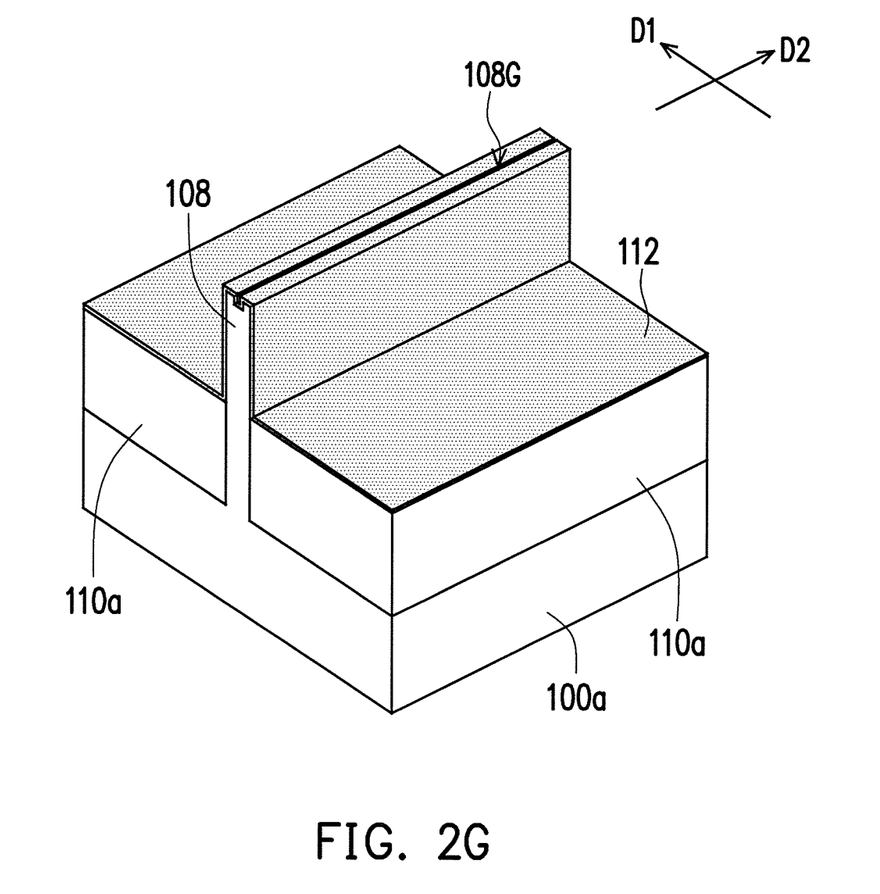

FIG. 2G is a perspective view of the semiconductor device at one of various stages of the manufacturing method. In Step S40 in FIG. 1 and as shown in FIGS. 2F-2G, a gate stack GS (shown in FIG. 2K) is formed so as to partially cover the semiconductor fin 108, the groove 108G and the insulators 110a. The formation of the gate stack GS (shown in FIG. 2K) is discussed in accompany with FIG. 2G through FIG. 2K.

As shown in FIG. 2G, after the groove 108G is formed, and a gate dielectric layer 112 is formed to conformally cover the insulators 110a and the semiconductor fin 108 having groove 108G. The groove 108G is conformally covered by the gate dielectric layer 112 and the groove 108G is not filled by the gate dielectric 112. In other words, the gate dielectric layer 112 is thin enough and the groove 108G is not entirely occupied by the gate dielectric layer 112. In one embodiment, the thickness of the gate dielectric layer 112 is in the range of about 20 nm to 50 nm. The gate dielectric layer 112 may include silicon oxide, silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. The gate dielectric layer 112 may be formed by a suitable process such as atomic layer deposition (ALD), chemical vapor deposition (CVD), physical vapor deposition (PVD), thermal oxidation, UV-ozone oxidation, or the like.

Figure 2H:
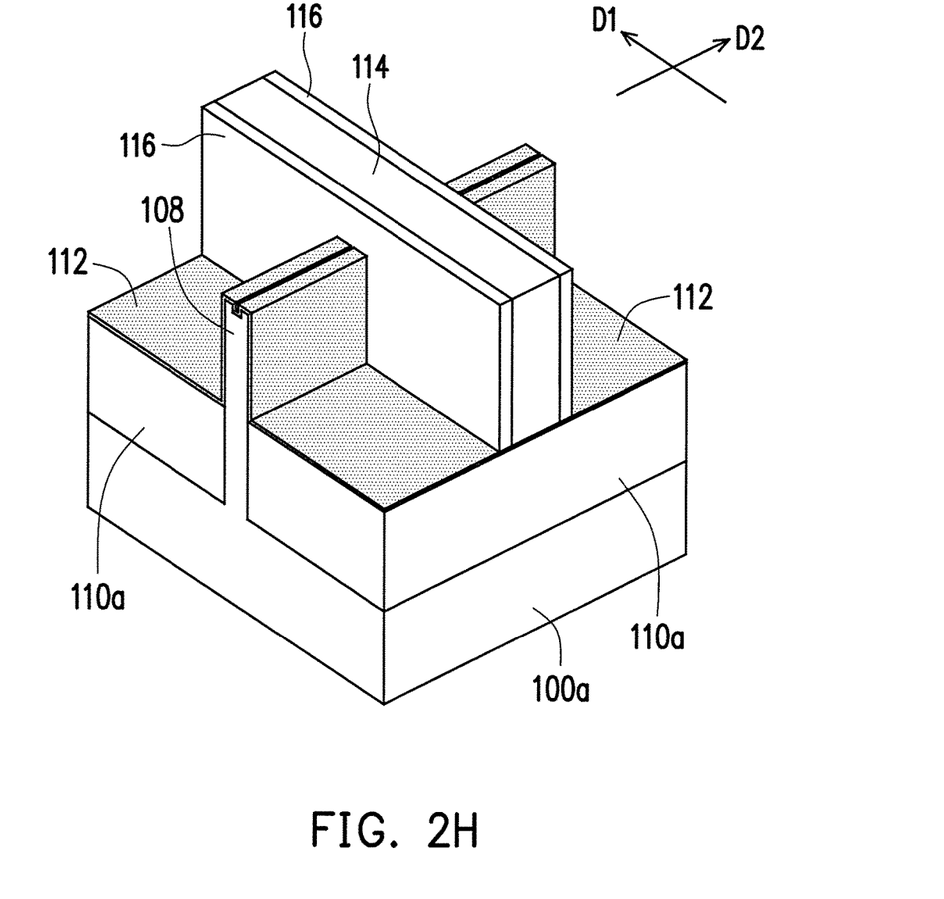

FIG. 2H is a perspective view of the semiconductor device at one of various stages of the manufacturing method. In Step S40 in FIG. 1 and as shown in FIGS. 2G-2H, at least one dummy gate strip 114 is formed on the gate dielectric layer 112, wherein a lengthwise direction D1 of the dummy gate strip 114 is different from the lengthwise direction D2 of the semiconductor fin 108. In some embodiments, the lengthwise direction D1 of the dummy gate strip 114 is perpendicular to the lengthwise direction D2 of the semiconductor fin 108. The number of the dummy gate strip 114 shown in FIG. 2H is merely for illustration, in some alternative embodiments, two or more parallel dummy gate strips may be formed in accordance with actual design requirements. The dummy gate strip 114 includes silicon-containing material, such as poly-silicon, amorphous silicon or a combination thereof.

It is noted that the groove 108G of the semiconductor fin 108 covered by or overlapped with the dummy gate strip 114 is filled-up by a portion of the dummy gate strip 114.

As shown in FIG. 2H, after the dummy gate strip 114 is formed, a pair of spacers 116 are formed on sidewalls of the dummy gate strip 114. The pair of spacers 116 are formed on the gate dielectric layer 112 and extend along the sidewalls of the dummy gate strip 114. The pair of spacers 116 are formed of dielectric materials, such as silicon nitride or SiCON. The pair of spacers 116 may include a single layer or multilayer structure.

Figure 2I:
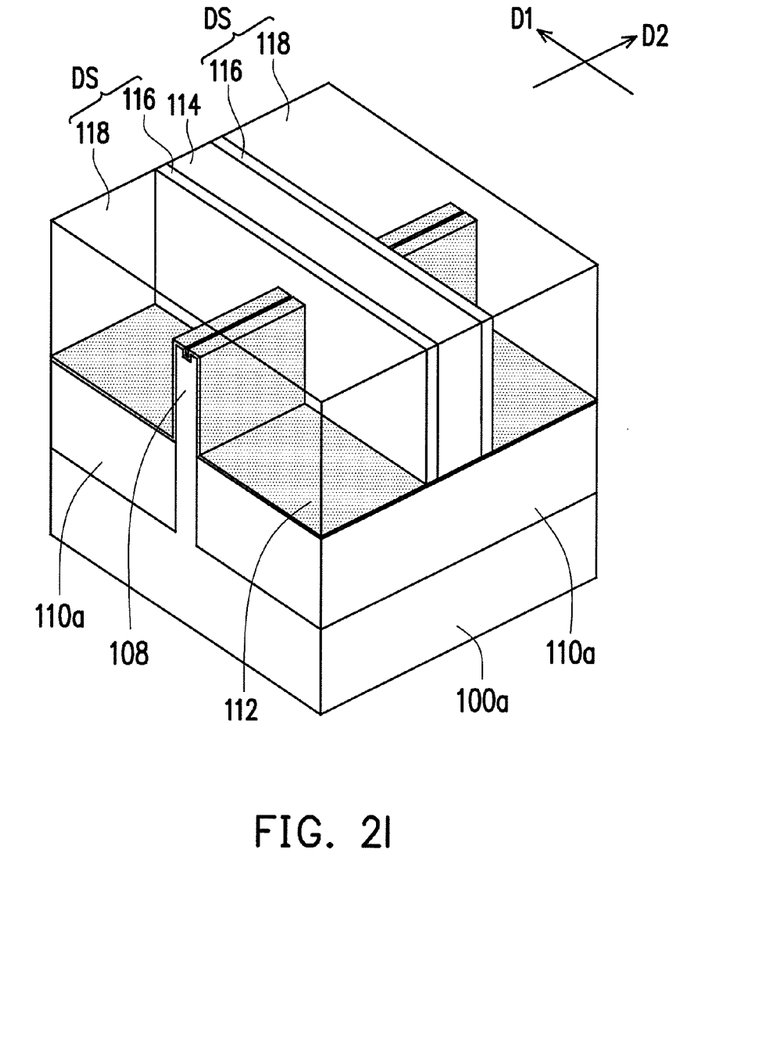

FIG. 2I is a perspective view of the semiconductor device at one of various stages of the manufacturing method. In Step S40 in FIG. 1 and as shown in FIGS. 2H-2I, a patterned dielectric layer 118 is formed to cover the gate dielectric layer 112 that are not covered by the dummy gate strip 114 and the spacers 116. A top surface of the patterned dielectric layer 118 is substantially coplanar with the top surface of the dummy gate strip 114, for example. In some embodiments, before the patterned dielectric layer 118 is formed, some processes (e.g., patterning process of gate dielectric layer 112, semiconductor fin recessing process, strained source/drain epitaxial process on the semiconductor fin, silicidation process and so on) may be performed in advance. Details of the aforesaid optional processes are omitted.

As shown in FIG. 2I, in one embodiment, the pair of spacers 116 formed on the sidewalls of the dummy gate strip 114 may be considered as a dielectric structure DS adjacent to the dummy gate strip 114. In an alternative embodiment, the combination of the pair of spacers 116 and the patterned dielectric layer 118 may be considered as a dielectric structure DS adjacent to the dummy gate strip 114. In other words, the dummy gate strip 114 may be embedded in the dielectric structure DS and the dielectric structure DS partially covers the semiconductor fin 108 and the insulators 110a.

Figure 2J:
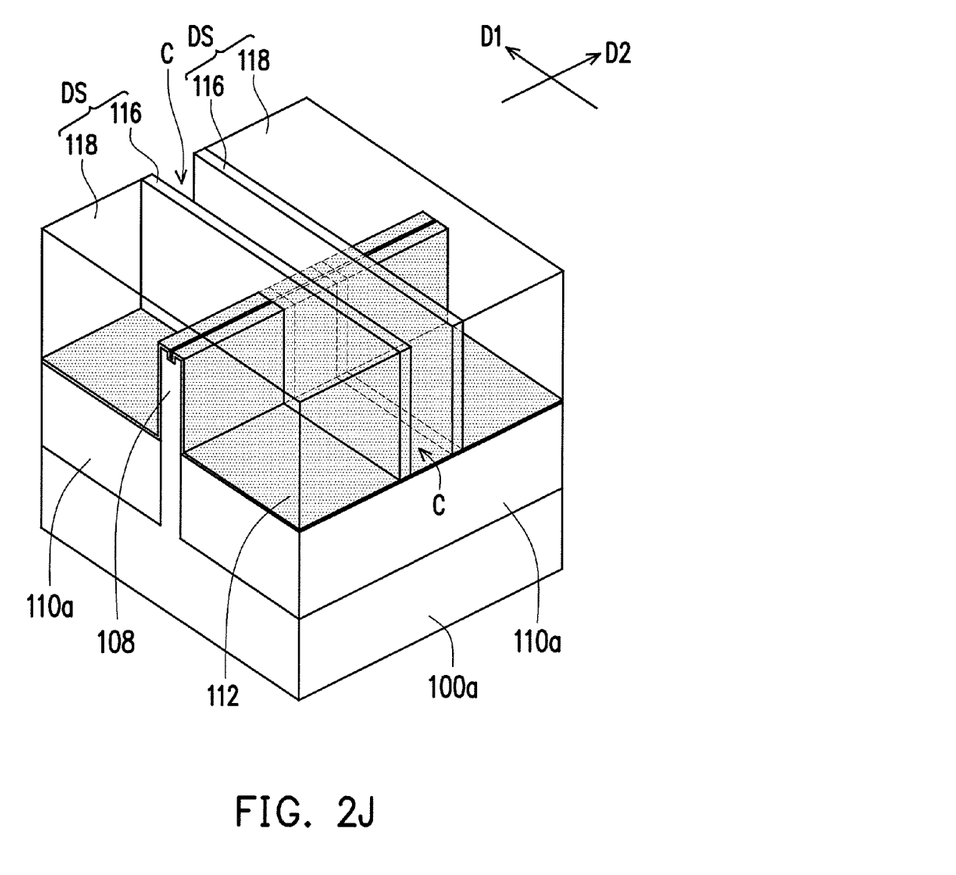

FIG. 2J is a perspective view of the semiconductor device at one of various stages of the manufacturing method. In Step S40 in FIG. 1 and as shown in FIGS. 2I-2J, the dummy gate strip 114 is removed. In one embodiment, the dummy gate strip 114 is removed, for example, by an etching process. Through properly selecting of etchant, the dummy gate strip 114 is removed without damaging the patterned dielectric layers 118, the gate dielectric layer 112 and the spacers 116 significantly. After the dummy gate strip 114 is removed, a cavity C between the pair of spacers 116 is formed. In other words, the dielectric gate layer 112 is partially exposed by the cavity C.

FIG. 2K is a perspective view of the semiconductor device at one of various stages of the manufacturing method. In Step S40 in FIG. 1 and as shown in FIGS. 2J-2K, after the cavity C is formed, a gate 122 is formed in and fills the cavity C and the gate 122 covers the gate dielectric layer 112 exposed by the cavity C. The width of the gate 122 may be identical with the width of the dummy gate strip 114 (as shown in FIG. 2I). The channel length of the FinFET is relevant to or is determined by the width of the gate 122. In other words, the portion of the semiconductor fin 108 that is overlapped with and covered by the gate 122 serves as a channel of a FinFET.

As shown in FIG. 2K, in one embodiment, the gate 122 and the gate dielectric layer 112 underneath are considered as a gate stack GS, the dielectric structure DS (e.g., the pair of spacers 116 or the combination of the pair of spacers 116 and the patterned dielectric layer 118) is formed on sidewalls of the gate stack GS, and the top surface of the dielectric structure DS is substantially coplanar with a top surface of the gate stack GS, for example. In alternative embodiments, the above-illustrated gate replacement process (FIG. 2J and FIG. 2K) may be omitted.

It is noted that, in some embodiments, the groove 108G may be formed and distributed on a predetermined portion area of the top surface T2 of the semiconductor fin 108, and the gate 122 covers or overlaps with the predetermined portion area on which the groove 108G is distributed. In alternative embodiments, the groove 108G may further distributed on the rest area of the top surface T2 that is not covered by or overlapped with the gate 122.

After the gate 122 is formed, the groove 108G of the semiconductor fin 108 covered by or overlapped with the gate 122 is filled-up by a portion of the gate 122. The affection area between the semiconductor fin 108 and the gate 122 increases due to the formation of the groove 108G. Since the groove 108G increases surface area of the semiconductor fin 108 and the affection area between the semiconductor fin 108 and the gate 122, the gate 122 controls the channel in the semiconductor fin 108 more effectively. Due to electronic skin effect, the increased surface area of the semiconductor fin 108 may increase saturation current and current density of the FinFET. Accordingly, current drive capability of the above-mentioned FinFETs is enhanced and high power FinFETs are obtained.

In accordance with some embodiments of the present disclosure, a FinFET comprising a substrate, a plurality of insulators and a gate stack is provided. The substrate comprises a plurality of trenches and at least one semiconductor fin between the trenches, wherein the semiconductor fin comprises at least one groove, and the at least one groove is located on a top surface of the semiconductor fin. The insulators are disposed in the trenches. The gate stack partially covers the semiconductor fin, the at least one groove and the insulators.

In accordance with alternative embodiments of the present disclosure, a FinFET comprising a substrate, a plurality of insulators, a gate dielectric layer and a gate is provided. The substrate comprises a plurality of trenches and at least one semiconductor fin between the trenches, wherein the semiconductor fin comprises at least one groove, and the at least one groove is located on a top surface of the semiconductor fin. The insulators are disposed in the trenches. The gate dielectric layer partially covers the semiconductor fin, the at least one groove and the insulators. The gate is disposed on the gate dielectric layer, wherein the groove is covered by the gate dielectric layer conformally and the at least one groove is filled by a portion of the gate.

In accordance with yet alternative embodiments of the present disclosure, a FinFET comprising a substrate, a plurality of insulators and a gate stack is provided. The substrate comprises a plurality of trenches and at least one semiconductor fin between the trenches, wherein the semiconductor fin comprises a base and a plurality of protrusions protruding upwardly from the base, and the protrusions are separated from each other. The insulators are disposed in the trenches. The gate stack partially covers the base, the protrusions and the insulators.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field effect transistor (FinFET), comprising:
a substrate comprising a plurality of trenches and at least one semiconductor fin between adjacent trenches of the plurality of trenches;
a plurality of insulators, wherein a respective insulator of the plurality of insulators is disposed in a respective trench of the plurality of trenches, the at least one semiconductor fin comprises an upper portion protruding above top surfaces of the plurality of insulators, the at least one semiconductor fin comprises at least one groove, the at least one groove extends along a lengthwise direction of the at least one semiconductor fin, the at least one groove is located on a top surface of the at least one semiconductor fin, a depth of the at least one groove ranges from about 3 nm to about 5 nm and a height of the at least one semiconductor fin ranges from about 20 nm to about 50 nm, and a length of the at least one groove along the lengthwise direction of the at least one semiconductor fin is equal to a length of the upper portion of the at least one semiconductor fin; and
a gate stack partially covering the at least one semiconductor fin, the at least one groove and the plurality of insulators.

2. The FinFET of claim 1, wherein the depth of the at least one groove is in a range from about 10% to about 15% of the height of the at least one semiconductor fin.

3. The FinFET of claim 1, wherein a width of the at least one groove is in a range from about 30% to about 50% of a width of the at least one semiconductor fin.

4. The FinFET of claim 1, wherein a width of the at least one groove ranges from about 3 nm to about 5 nm and a width of the at least one semiconductor fin ranges from about 20 nm to about 50 nm.

5. The FinFET of claim 1, wherein the at least one groove comprises a plurality of parallel grooves.

6. The FinFET of claim 1, wherein the at least one groove comprises a plurality of grooves distributed on the top surface of the at least one semiconductor fin.

7. A fin field effect transistor (FinFET), comprising:
a substrate comprising a plurality of trenches and at least one semiconductor fin between adjacent trenches of the plurality of trenches;
a plurality of insulators, wherein a respective insulator of the plurality of insulators is disposed in a respective trench of the plurality of trenches, the at least one semiconductor fin comprises an upper portion protruding above top surfaces of the plurality of insulators, the at least one semiconductor fin comprises at least one groove, the at least one groove extends along a lengthwise direction of the at least one semiconductor fin, the at least one groove is located on a top surface of the at least one semiconductor fin, a depth of the at least one groove ranges from about 3 nm to about 5 nm and a height of the at least one semiconductor fin ranges from about 20 nm to about 50 nm, and a length of the at least one groove along the lengthwise direction of the at least one semiconductor fin is equal to a length of the upper portion of the at least one semiconductor fin;
a gate dielectric layer partially covering the at least one semiconductor fin, the at least one groove and the plurality of insulators; and
a gate disposed on the gate dielectric layer, wherein the at least one groove is covered by the gate dielectric layer conformally and the at least one groove is filled by a portion of the gate.

8. The FinFET of claim 7, wherein the depth of the at least one groove is in a range from about 10% to about 15% of the height of the at least one semiconductor fin.

9. The FinFET of claim 7, wherein a width of the at least one groove is in a range from about 30% to about 50% of a width of the at least one semiconductor fin.

10. The FinFET of claim 7, wherein a width of the at least one groove ranges from about 3 nm to about 5 nm and a width of the at least one semiconductor fin ranges from about 20 nm to about 50 nm.

11. The FinFET of claim 7, wherein the at least one groove comprises a plurality of parallel grooves.

12. The FinFET of claim 7, wherein the at least one groove comprises a plurality of grooves distributed on the top surface of the at least one semiconductor fin.

13. A fin field effect transistor (FinFET), comprising:
a substrate comprising a plurality of trenches and at least one semiconductor fin between adjacent trenches of the plurality of trenches;
a plurality of insulators, wherein a respective insulator of the plurality of insulators is disposed in a respective trench of the plurality of trenches, the at least one semiconductor fin comprises an upper portion protruding above top surfaces of the plurality of insulators, the upper portion of the at least one semiconductor fin comprises a base and a plurality of protrusions protruding upwardly from the base, the plurality of protrusions are separated from each other, each protrusion of the plurality of protrusions extends along a lengthwise direction of the at least one semiconductor fin, a height of each protrusion of the plurality of protrusions ranges from about 3 nm to about 5 nm and a height of the at least one semiconductor fin ranges from about 20 nm to about 50 nm, and a length of each protrusion of the plurality of protrusions along the lengthwise direction of the at least one semiconductor fin is equal to a length of the upper portion of the at least one semiconductor fin; and a gate stack partially covering the base, the plurality of protrusions and the plurality of insulators.

14. The FinFET of claim 13, wherein the height of each protrusion of the plurality of protrusions is in a range from about 10% to about 15% of the height of the at least one semiconductor fin.

15. The FinFET of claim 13, wherein a gap between two adjacent protrusions of the plurality of protrusions ranges from about 3 nm to about 5 nm.

16. The FinFET of claim 1, wherein the at least one groove extends continuously from one end of the upper portion of the at least one semiconductor fin to another end of the upper portion of the at least one semiconductor fin along the lengthwise direction of the at least one semiconductor fin.

17. The FinFET of claim 1, wherein the length of the at least one groove along the lengthwise direction of the at least one semiconductor fin is greater than a width of the gate stack along the lengthwise direction of the at least one semiconductor fin.

18. The FinFET of claim 7, wherein the length of the at least one groove along the lengthwise direction of the at least one semiconductor fin is greater than a width of the gate along the lengthwise direction of the at least one semiconductor fin.

19. The FinFET of claim 13, wherein each protrusion of the plurality of protrusions extends continuously from one end of the upper portion of the at least one semiconductor fin to another end of the upper portion of the at least one semiconductor fin along the lengthwise direction of the at least one semiconductor fin.

20. The FinFET of claim 13, wherein the length of each protrusion of the plurality of protrusions along the lengthwise direction of the at least one semiconductor fin is greater than a width of the gate stack along the lengthwise direction of the at least one semiconductor fin.

\* \* \* \* \*